United States Patent
Tanaka et al.

(10) Patent No.: US 9,660,601 B2
(45) Date of Patent: May 23, 2017

(54) AMPLIFIER WITH COMPENSATION OF GAIN IN LOW FREQUENCIES

(71) Applicant: SUMITOMO ELECTRIC INDUSTRIES, LTD., Osaka-shi, Osaka (JP)

(72) Inventors: Keiji Tanaka, Yokohama (JP); Yoshiyuki Sugimoto, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/136,644

(22) Filed: Apr. 22, 2016

(65) Prior Publication Data

US 2016/0329869 A1 Nov. 10, 2016

(30) Foreign Application Priority Data

May 8, 2015 (JP) .................................. 2015-095410

(51) Int. Cl.
*H03F 3/45* (2006.01)
*H03F 1/34* (2006.01)
(Continued)

(52) U.S. Cl.
CPC ......... *H03F 3/45085* (2013.01); *H03F 1/083* (2013.01); *H03F 1/34* (2013.01);
(Continued)

(58) Field of Classification Search
CPC ...................................................... H03F 3/45
(Continued)

(56) References Cited

U.S. PATENT DOCUMENTS 6,894,564 B1 * 5/2005 Gilbert .................. H03F 3/45
    330/254
7,532,076 B2 * 5/2009 Hanada .................. H03F 1/52
    330/252

(Continued)

FOREIGN PATENT DOCUMENTS

JP   H07-240640 A    9/1995
JP   2000-349571 A   12/2000
(Continued)

*Primary Examiner* — Henry Choe
(74) *Attorney, Agent, or Firm* — Global IP Counselors, LLP

(57) ABSTRACT

An amplifier includes a differential amplifier and a compensator. A differential amplifier includes a current source and paired transistors. The paired transistors generate an output signal by dividing a source current supplied by the current source into emitter currents of the paired transistors in response to a difference between an input signal and a reference signal. A compensator includes an amplifying transistor and a feedback circuit that feeds a collector current output from a collector of the amplifying transistor back to a base of the amplifying transistor therethrough. The compensator generates the reference signal at a base of the amplifying transistor. The compensator decreases power consumption of the amplifying transistor when the collector current increases, and increases the power consumption of the amplifying transistor when the collector current decreases. The compensator suppresses a peaking of gain in a low frequency band.

13 Claims, 12 Drawing Sheets

(51) Int. Cl.
  *H03F 3/213*  (2006.01)
  *H03F 1/08*  (2006.01)
(52) U.S. Cl.
  CPC ....... *H03F 3/213* (2013.01); *H03F 2200/153* (2013.01); *H03F 2200/24* (2013.01); *H03F 2203/45022* (2013.01); *H03F 2203/45026* (2013.01); *H03F 2203/45288* (2013.01)
(58) Field of Classification Search
  USPC ................................................ 330/259, 252
  See application file for complete search history.

(56) References Cited

U.S. PATENT DOCUMENTS

| | | | |
|---|---|---|---|
| 7,746,176 B2 * | 6/2010 | Van Der Heijden | ............ H03F 3/45089 330/252 |
| 9,030,257 B2 | 5/2015 | Itabashi et al. | |
| 2006/0284678 A1 * | 12/2006 | Dillon | ...................... H03F 3/45 330/252 |

FOREIGN PATENT DOCUMENTS

| JP | 2010-136169 A | 6/2010 |
|---|---|---|
| JP | 2013-138400 A | 7/2013 |

\* cited by examiner

AMPLIFIER WITH COMPENSATION OF GAIN IN LOW FREQUENCIES

CROSS-REFERENCE TO RELATED APPLICATIONS

This U.S. application claims priority under 35 U.S.C. §119(a) to Japanese Patent Application No. 2015-095410, filed in Japan on May 8, 2015, the entire contents of which are hereby incorporated herein by reference.

BACKGROUND OF THE INVENTION

1. Field of the Invention

The present invention relates to an amplifier, and more specifically to a trans-impedance amplifier that converts a current signal into a voltage signal with amplification.

2. Description of the Related Art

An optical receiver used in an optical communication system often includes a differential amplifier that amplifies a differential input signal. The Patent Literatures 1 to 3 have disclosed some configurations of the differential amplifier.

The Patent Literature 1 has disclosed a configuration that comprises a differential amplifier and an offset compensator. The differential amplifier amplifies an input signal input through a coupling capacitor and outputs the amplified signal as a differential output signal. The offset compensator includes a low pass filter that passes and outputs only low frequency components less than a cutoff frequency of the differential output signal and a bias adjusting circuit that adjusts a DC bias potential of the differential input signal depending on the low frequency components output from the low pass filter.

The Patent Literature 2 has disclosed a configuration that includes a trans-impedance differential amplifier and a bypass circuit. The trans-impedance differential amplifier converts an input current signal into an output voltage signal with amplification. The bypass circuit bypasses an excessive portion of the input current signal as a bypass current so as to prevent the output voltage signal from being saturated and maintain gain of the amplification less than a predetermined value for avoiding oscillation against an input current signal with large magnitude.

The Patent Literature 3 has disclosed a configuration that includes a differential amplifier, a threshold circuit, and a filter circuit. The differential amplifier has a pair of input terminals. The one of the input terminals receives a photo-current output from a photodetector (PD) and the other of the input terminals receives a threshold supplied from the threshold circuit. The filter circuit is connected between the differential amplifier and the threshold circuit, and includes a multiple filter attributed to at least two time constants.

Patent Literature 1: Japanese Patent Application Laid-Open No. H7-240640.
Patent Literature 2: Japanese Patent Application Laid-Open No. 2000-349571.
Patent Literature 3: Japanese Patent Application Laid-Open No. 2010-136169.

SUMMARY OF THE INVENTION

According to an aspect of the present invention, there is provided an amplifier that amplifies an input signal and generates a differential signal derived from the input signal. The amplifier includes a differential amplifier and a compensator. The differential amplifier includes a first current source, first paired transistor, and a second paired transistor. The first current source supplies a first source current. The first paired transistor receives the input signal at a base thereof. The second paired transistor receives a reference signal at a base thereof. The first paired transistor and the second paired transistor are configured to divide the first source current into a first current and a second current in response to a difference between the input signal and the reference signal. The first current flows through an emitter of the first paired transistor. The second current flows through an emitter of the second paired transistor. The differential amplifier is configured to output a voltage difference between collectors of the first paired transistor and the second paired transistor as the differential signal. A compensator includes an amplifying transistor and a feedback circuit that feeds a collector current output from a collector of the amplifying transistor back to a base of the amplifying transistor therethrough. The compensator is configured to generate the reference signal at the base of the amplifying transistor. The compensator decreases power consumption of the amplifying transistor when the collector current of the amplifying transistor increases, and increases the power consumption of the amplifying transistor when the collector current of the amplifying transistor decreases.

In an optical communication field, it has been known that some amplifier, for example, TIA (Trans-impedance Amplifier), shows a peaking (increase) in gain in a low frequency band, less than a cutoff frequency. Specifically, when HBTs (Hetero-junction Bipolar Transistors) constitute a TIA, so-called a self-heating effect thereof causes the peaking. For example, magnitude of the peaking becomes about 2 to 3 dB. Frequency dependence of a gain ripple owing to such peaking in a low frequency band deteriorates performance of the TIA, for example, sensitivity.

An amplifier according to the embodiments of the present invention suppresses a peaking in gain in a low frequency band.

DESCRIPTION OF THE PREFERRED EMBODIMENTS

Figure 1:
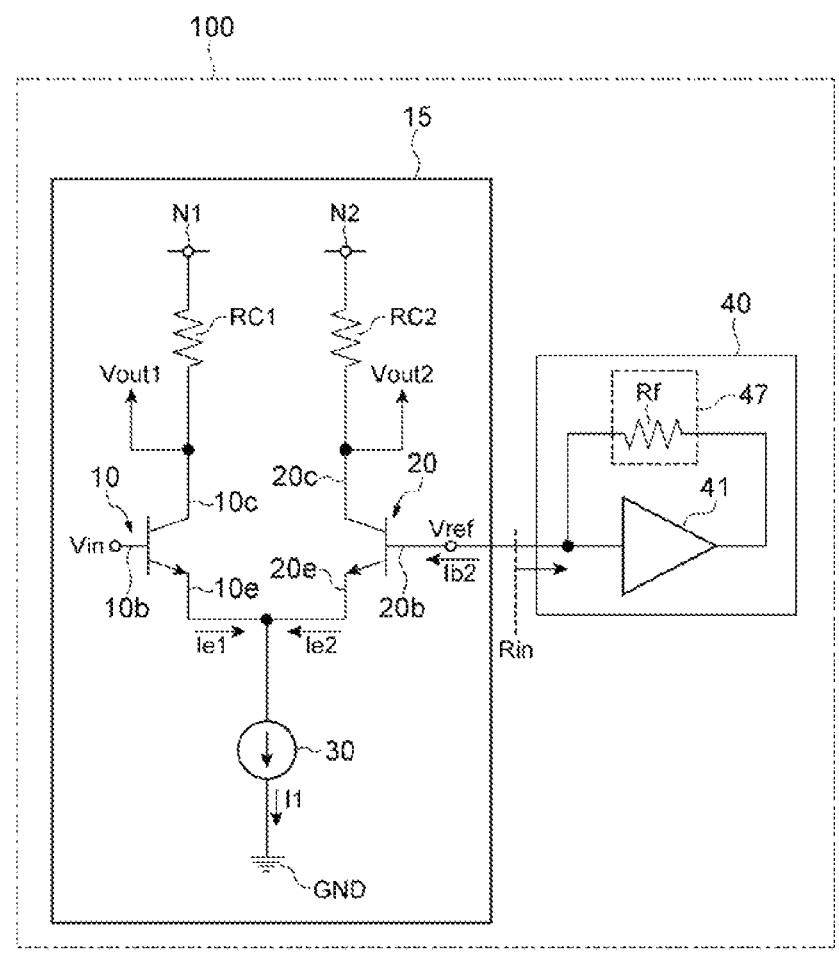
FIG. 1 is a circuit diagram of an amplifier according to an embodiment of the present invention.

Hereinafter, an amplifier according to an embodiment of the present invention will be described in detail with reference to the attached drawings. Note that the same components in the description of the drawings are indicated by the same reference numerals, and overlapping descriptions are omitted.

The First Embodiment

FIG. 1 is a circuit diagram of an amplifier according to the first embodiment of the present invention. The amplifier 100 converts an input signal Vin into a differential signal and outputs the differential signal. The input signal Vin is a single-ended signal. The differential signal includes two signals complementary to each other, that is, two signals output from the amplifier 100 have phases opposite to each other. In the FIG. 1, an output signal Vout1 corresponds to one of the complementary signals and another output signal Vout2 corresponds to the other of the complementary signals. The amplifier 100, for example, may be installed in an optical receiver used in optical communication systems. In such application, the optical receiver generates the input signal Vin depending on an optical signal that the optical receiver receives.

As shown in FIG. 1, the amplifier 100 includes a differential amplifier 15 and a compensating circuit 40 (compensator). The differential amplifier 15 includes a pair of transistors 10, 20 (first paired transistor and second paired transistor), a current source 30 (first current source), and resistive elements RC1, RC2.

The transistor 10 is a first paired transistor that has a base 10b, a collector 10c, and an emitter 10e. The base 10b receives the input signal Vin. The collector 10c outputs the output signal Vout1. The emitter 10e is connected with the current source 30.

The transistor 20 is a second paired transistor that has a base 20b, a collector 20c, and an emitter 20e. The base 20b receives a reference signal Vref. The collector 20c outputs the output signal Vout2. The emitter 20e is connected with the current source 30.

In the differential amplifier 15, the transistors 10, 20 may be bipolar transistors, specifically, HBTs (Hetero-junction Bipolar Transistors).

The current source 30 is a first current source configured to supply a source current I1 (first source current) to the transistors 10, 20. The current source 30 is connected between the ground (GND) and commonly connected emitters 10e, 20e of the transistors 10, 20, so that the source current I1 flows from the transistors 10, 20 into the ground. The current source 30 may be configured by using transistors, diodes, resistive elements, and so on. The configuration of the current source 30 is not restricted to a specific example shown in FIG. 1.

The resistive element RC1 is connected between the collector 10c of the transistor 10 and a node N1. The node N1 supplies a supply voltage, for example, 5V which is necessary for operating the transistor 10. The resistive element RC2 is connected between the collector 20c of the transistor 20 and a node N2. The node N2 supplies another supply voltage, for example, 5V which is necessary for operating the transistor 20.

The differential amplifier 15 receives the input signal Vin at the base 10b of the transistor 10 and the reference signal Vref at the base 20b of the transistor 20. The transistors 10, 20 divide the source current I1 into an emitter current Ie1 that flows through the emitter 10e and an emitter current Ie2 that flows though the emitter 20e in response to a difference between the input signal Vin and the reference signal Vref. The differential amplifier 15 generates a differential signal Vout2−Vout1 by a voltage difference between the collectors 10c, 20c of the transistors 10, 20.

The compensator 40 generates the reference signal Vref to be supplied to the base 20b of the transistor 20. The compensator 40 also supplies a base current Ib2 to the base 20b. The compensator 40 includes an amplifying element 41, corresponding to the transistor 42 in FIG. 2, and a feedback circuit 47 that may be a resistive element Rf.

Figure 2:
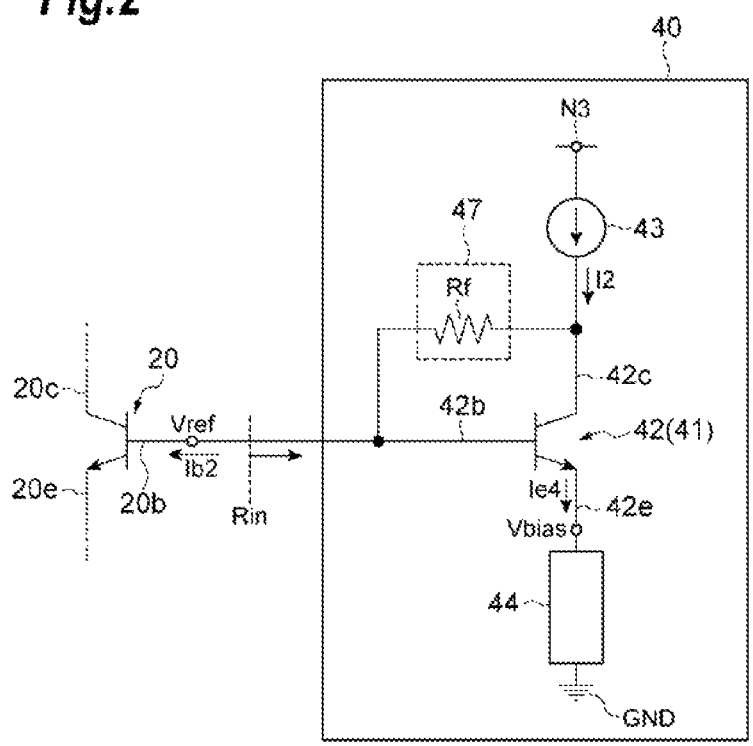
FIG. 2 is a circuit diagram of an example of the compensator illustrated in FIG. 1.

FIG. 2 is a circuit diagram of an example of the compensator illustrated in FIG. 1. As shown in FIG. 2, the compensator 40 includes a transistor 42 (amplifying element 41), a resistive element Rf, a current source 43 (second current source), and a bias circuit 44.

The transistor 42 is an amplifying transistor that has a base 42b, a collector 42c, and an emitter 42e. The transistor 42 may be a bipolar transistor, specifically, a hetero-junction bipolar transistor like the transistors 10, 20. The transistors 10, 20, and 42 may be concurrently formed on a semiconductor die by a conventional semiconductor process. For example, the amplifier 100 may be formed on a common semiconductor die. The base 42b is connected with the base 20b of the transistor 20. The collector 42c is connected with the current source 43. The emitter 42e is connected with the bias circuit 44. The transistors 10, 20, and 42 formed on a single semiconductor wafer may be regarded to have temperatures same to each other when they are operating, as long as a size of the semiconductor die is less than 10 mm square.

The resistive element Rf feeds the output signal generated at the collector 42c of the transistor 42 back to the base 42b of the transistor 42. In the compensator 40, the resistive element 47 is connected between the collector 42c and the base 42b to configure a feedback loop.

The current source 43 is a second current source configured to supply a source current I2 (second source current) to the transistor 42. The current source 42 is connected between a node N3 and the collector 42c of the transistor 42, so that the source current I2 flows from the node N3 to the collector 42c of the transistor 42. The node N3 supplies a supply voltage which is necessary for operating the transistor 42. The current source 42 may have the same configuration as the current source 30 in FIG. 1. The source current I2 supplied by the current source 43 partly flows into the base 42b of the transistor 42 through the resistive element Rf. The transistor 42 and the resistive element Rf constitute a negative feedback circuit. At the same time, rest portion of the source current I2 supplied by the current source 43 except the collector current of the transistor 42 flows into the base 20b of the transistor 20 through the resistive element Rf. Accordingly, the compensator 40 provide a base current Ib2 to the base 20b of the transistor 20 through the negative feedback circuit mentioned above.

The bias circuit 44 generates a bias voltage by making an emitter current Ie4 output from the transistor 42 flow thereinto. The voltage drop of the bias circuit 44 caused by the emitter current Ie4 provides the bias voltage. The bias circuit 44 is connected between the emitter 42e of the transistor 42 and the ground (GND). Thereby, the compensator 40 provides the reference signal Vref, which is a sum of the bias voltage Vbias and the base-emitter voltage of the transistor 42, to the base 20b of the transistor 20. Namely, the compensator 40 outputs the sum of the bias voltage Vbias and the voltage between the base 42b and emitter 42e of the transistor 42, as the reference signal Vref. If the emitter 42e of the transistor 42 is directly grounded without the bias circuit 44, only the base-emitter voltage of the transistor 42 is applied to the base 20b of the transistor 20 and the reference signal Vref becomes insufficient for properly operating the transistor 20. Therefore, the bias circuit 44 allows the compensator 40 to supply the reference signal Vref sufficient for operating the transistor 20 to the base 20b of the transistor 20.

In the compensator 40, the operational condition of the transistor 42 is set so that power consumption of the transistor 42 decreases when the collector current of the transistor 42 increases. Adjusting a bias point and a load line for the transistor 42 provides the operational condition of the transistor 42. The bias point is independent of the bias voltage generated by the bias circuit 44. The bias point may be represented in statistic characteristics of the bipolar transistor. For example, the statistic characteristics may be graphs that represent relationship between collector-emitter voltage and collector current of the bipolar transistor. The load line may be a graph that shows possible trace of the operating point in the statistic characteristics when the bipolar transistor is driven by an input signal. The operating point coincides with the bias point when the bipolar transistor has no input signal. Therefore, the load line includes the bias point as a reference point.

Figure 3:
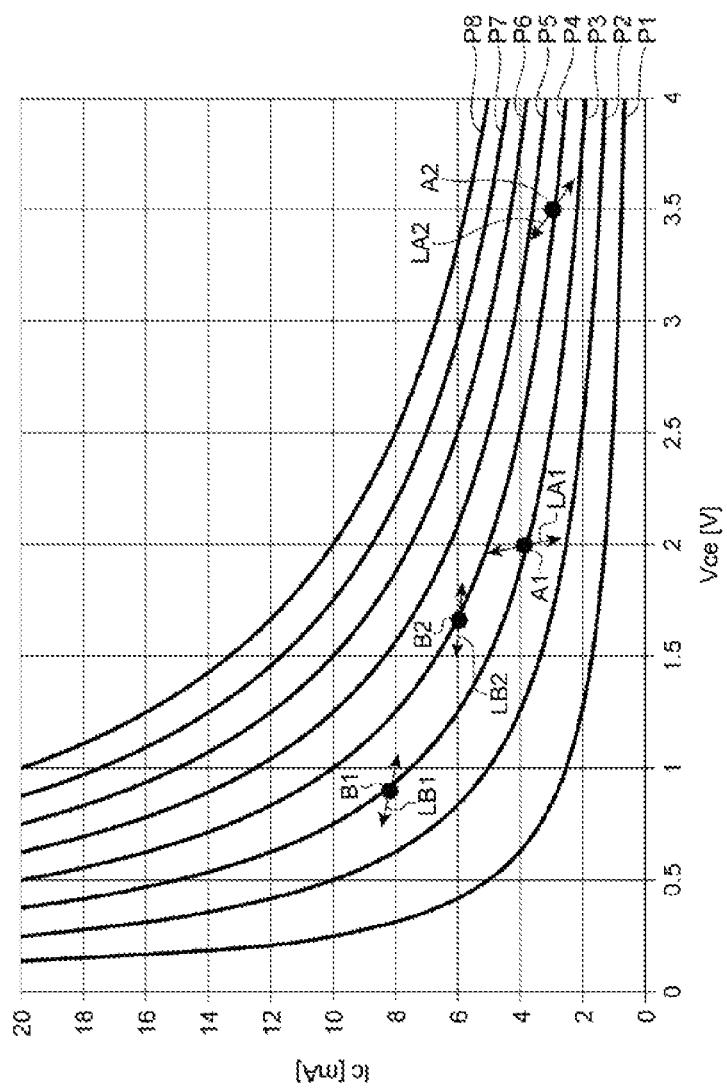
FIG. 3 is a graph representing relationship between collector-emitter voltage and collector current of a bipolar transistor when power consumption of the bipolar transistor is kept constant in the embodiment of the present invention.

FIG. 3 is a graph showing a relationship between a collector-emitter voltage and a collector current of the bipolar transistor when the power consumption of the bipolar transistor is kept constant in the embodiment of the present invention. In FIG. 3, the horizontal axis corresponds to a collector-emitter voltage Vce, while the vertical axis corresponds to a collector current Ic.

The graph in FIG. 3 have eight curves P1 to P8. The curves P1 to P8 correspond to contour lines in power consumption of the bipolar transistor. The power consumption may be calculated as a product of the collector-emitter voltage Vce and corrector current Ic. A contour line in power consumption shows combinations of the collector-emitter voltage Vce and collector current Ic for the constant power consumption. For example, the curve P1 corresponds to a contour line for the power consumption of 2.5 mW. The curve P8 corresponds to a contour line for the power consumption of 20 mW. The other curves P2 to P7 correspond to contour lines for the power consumption from 5.0 mW to 17.5 mW with a constant interval of 2.5 mW, respectively.

In the curves P1 to P8, the collector current Ic shows relatively large change when the collector-emitter voltage Vce is relatively small, for example, less than 1.7V. In contrast, the corrector current Ic shows relatively small change when the collector-emitter voltage Vce is relatively large, for example, greater than 1.7V.

When an AC signal is input to a bipolar transistor, an operating point of the bipolar transistor may move on a load line, because the bipolar transistor driven by the AC signal may have deviation of the power consumption from a bias point. The load line includes the bias point as a reference point. Namely, the operating point coincides with the bias point when the AC signal has no amplitude. In FIG. 3, four bias point A1, A2, B1, and B2 are indicated as examples. In addition, the load lines LA1, LA2, LB1, and LB2 that include the bias point A1, A2, B1, and B2, respectively are indicated as examples.

The bias points A1 and B1 are included in the curve P3, corresponding to the power consumption of 7.5 mW. The collector-emitter voltage Vce at the bias point A1 becomes larger compared with that at the bias point B1 but the collector current Ic at the bias point A1 becomes smaller that at the bias point B1. The load line LA1 including the bias point A1 has a larger slope $\Delta Ic/\Delta Vce$ in comparison with that of the load line LB1 including the bias point B1. The slope $\Delta Ic/\Delta Vce$ depends on resistance of a load element connected a collector of the bipolar transistor. Accordingly, the difference of the slope $\Delta Ic/\Delta Vce$ means that different resistances are selected for the bias points A1 and B1.

The bias point A2 and B2 are included in the curve P4 corresponding to the power consumption of 10 mW. The collector-emitter voltage Vice at the bias point A2 is larger than that at the bias point B2 but the collector current Ic at the bias point A2 becomes smaller than that at the bias point B2. The load line LA2 including the bias point A2 has a larger slope $\Delta Ic/\Delta Vce$ in comparison with that of the load curve LB2 including the bias point B2. the difference of the slope $\Delta Ic/\Delta Vce$ comes from difference between respective resistances selected for the bias points. The difference of the slope $\Delta Ic/\Delta Vce$ comes from different between the resistance selected for the bias point A2 and the resistance selected for the bias point B2.

For example, when the operational condition is set to the bias point A1 and the load line LA1, an increase in the collector current Ic makes the power consumption larger, that is, the operating point approaches the curve P4 from the curve P3 on the load line LA1. In contrast, a decrease in the collector current Ic makes the power consumption smaller, that is, the operating point approaches the curve P2 from the curve P3 on the line LA1. When the operational condition is set to the bias point B1 and the load curve LB1, an increase in the collector current Ic makes the power consumption smaller, that is, the operating point approaches the curve P2 from the curve P3 on the load line LB1. Also, a decrease in the collector current Ic makes the power consumption larger, that is, the operating point approaches the curve P4 from P3 on the load line LB1. The bias points A2, B2 and the load lines LA2, LB2 have a relationship similar to the bias points A1, B1 and the load lines LA1, LB1.

As explained above, the bipolar transistor is able to take two types of operational conditions, a first operation mode and second operation mode. In the first operation mode, an increase in the collector current Ic2 provides an increases in the power consumption of the bipolar transistor like a transition on the load line LA1 from the bias point A1 and another transition on the load line LA2 from the bias point A2. While, in the second operation mode, an increase in the collector current Ic2 provides a decrease in the power consumption of the bipolar transistor like a transition on the load curve LB1 from of the bias points B1 and another transition on the load line LB2 from the bias point B2.

Which of the two operation modes is set in a transistor is optional depending on a bias point and a load line drawn from the operating point. For the compensator 40 in FIG. 2, the bias point and the load line for the transistor 42 may be set such that the operating point of the transistor 42 is in the second operation mode. Moreover, for the amplifier 100, the operating points and the load curves lines for the transistors 10, 20 are set so that the operating points of the transistors 10, 20 are in the first operation mode.

For example, the bias point and the load line for the transistor 42 may be adjustable depending on the resistive element Rf, the source current I2 supplied by the current source 43, a supply voltage, and a bias voltage Vbias provided by the bias circuit 44 in the compensator 40 shown in FIG. 2. In addition, the bias points and the load lines for the transistors 10, 20 may be adjustable depending on the resistive elements RC1, RC2, the source current I1 supplied by the current source 30, the supply voltages to the nodes N1, N2, and the input signal Vin and the reference signal Vref.

Here, the power consumption of the bipolar transistor causes so-called a self-heating effect and affects a temperature of the bipolar transistor depending on frequency components of an input signal. In comparison with a reference temperature at which power consumption has a typical value, an increase from the typical power consumption raises the temperature of the bipolar transistor, and a decrease from the typical power consumption drops the temperature of the bipolar transistor. Trans-conductance, which is sometimes called as the mutual conductance, depends on a temperature of the bipolar transistor. Therefore, a change in the power consumption causes a change in Trans-conductance. The relationship between the power consumption and Trans-conductance in a low frequency band is different from that in a high frequency band.

For example, when an input signal containing only low frequencies drives the bipolar transistor, the temperature of the bipolar transistor responds to instant power consumption that relatively slowly changes in response to the input signal. In contrast, when an input signal containing high frequencies drives the bipolar transistor, the temperature of the bipolar transistor becomes unable to respond to the instant power consumption that quickly changes synchronous with the input signal, and stays in a constant temperature that depends on an average of the power consumption. Therefore, the bipolar transistor shows an unique thermal response depending on frequency components of an input signal. Accordingly, when the bipolar transistor is driven by an input signal, the trans-conductance of the bipolar transistor in a low frequency shows a difference from that in a high frequency. The details of the difference will be explained with reference to FIG. 4.

Figure 4:
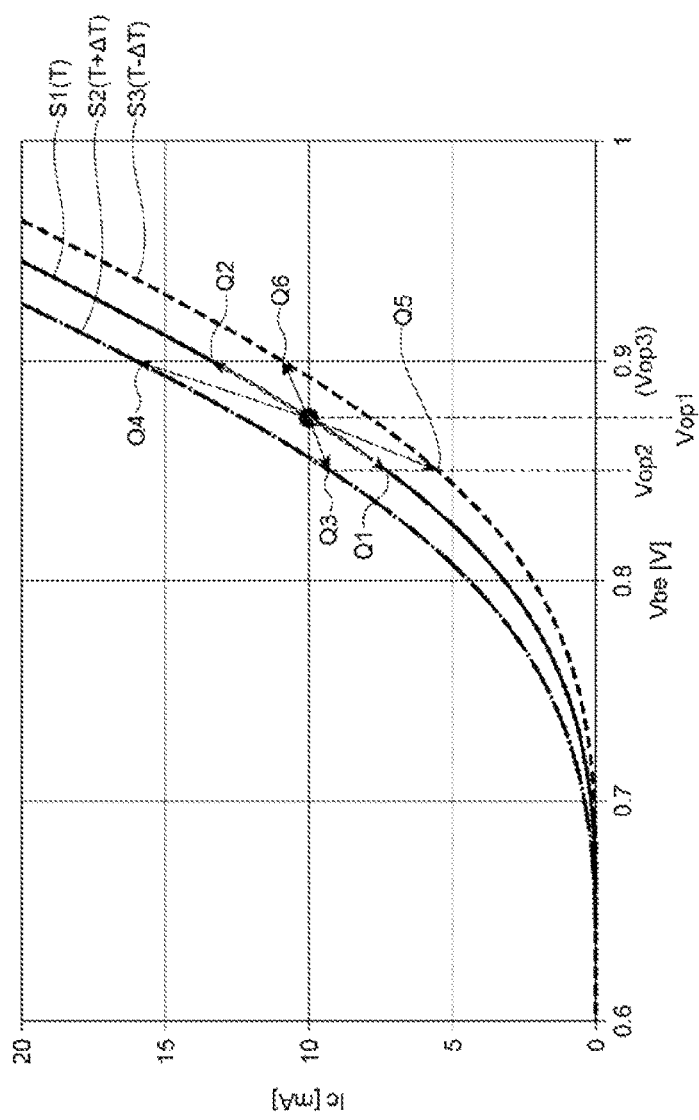
FIG. 4 is transfer characteristics of a bipolar transistor in the embodiment of the present invention.

FIG. 4 is transfer characteristics of a bipolar transistor according to the embodiment of the present invention. The horizontal axis corresponds to a base-emitter voltage Vbe while, the vertical axis corresponds to a collector current Ic. FIG. 4 shows three curves S1 to S3, which correspond to temperatures T (° C.), T+ΔT (° C.), and T−ΔT (° C.), respectively. Here, the bipolar transistor is assumed to be operating under the condition of the bias voltage Vbe=Vop1.

First, a case in which an input signal containing high frequencies drives a bipolar transistor such that the temperature of the bipolar transistor may not follow the input signal and becomes stable (in a constant temperature) will be explained. When a voltage signal that is input to the base of the bipolar transistor changes from −ΔV to +ΔV around the bias voltage Vop1, the transfer characteristic of the bipolar transistor corresponds to the curve S1. In this case, the trans-conductance gm1, which is defined as gm1=ΔIc/ΔVbe, corresponds to the slope of a line connecting two points Q1, Q2, at which the base-emitter voltages Vbe become Vop2=Vop1−ΔV and Vop3=Vop1+ΔV, respectively.

Next, another case in which the temperature of the bipolar transistor changes by the self-heating effect will be explained. In this case, the amplifier 100 takes the first operation mode and the second operating mode alternatively depending on the frequencies of the input signal.

A case in which a bipolar transistor is driven by an input signal containing only low frequencies is explained. In this case, an increase in the base-emitter voltage Vbe from the voltage Vop1 increases the collector current Ic, and thereby the power consumption of the bipolar transistor increases. Moreover, an increase in the power consumption raises the temperature of the bipolar transistor, so that the transfer characteristic of the bipolar transistor approaches the curve S2. Contrarily, a decrease in the base-emitter voltage Vbe from the voltage Vop1 reduces the collector current Ic, and thereby the power consumption of the bipolar transistor decreases. Then, the decrease in the power consumption drops the temperature of the bipolar transistor, so that the transfer characteristic of the bipolar transistor approaches the curve S3. Accordingly, the trans-conductance gm2 of the bipolar transistor that operates under the first operation mode substantially corresponds to the slope of the line connecting the two points Q5 on the curve S3 and Q4 on the curve S2, at which the base-emitter voltage Vbe become Vop2 and Vop3, respectively. The trans-conductance gm2 becomes larger than the aforementioned trans-conductance gm1 corresponding to the slope of the line connecting the two points Q1 and Q2, as shown in FIG. 4.

Next, another case in which the bipolar transistor is driven by a signal containing high frequencies but operates under the first operation mode will be explained. In this case, as described above, the temperature of the bipolar transistor becomes unable to respond to the instant power consumption that quickly changes synchronous with the input signal, and stays in a constant temperature that depends on an average of the power consumption, specifically the temperature T (° C.) in FIG. 4. Accordingly, the trans-conductance of this case becomes equal to gm1.

As explained above, when the bipolar transistor operates under the first operation mode, the trans-conductance in the low frequencies becomes larger than that in the high frequencies. This is due to the reason why the differential amplifier shows some peaks in the gain at low frequencies when the bipolar transistors that constitute the differential amplifier may be heated by the currents flowing therein.

Third, still another case in which the bipolar transistor driven by an input signal containing only low frequencies operates under the second operation mode is explained. In this case, an increase in the base-emitter voltage Vbe from the voltage Vop1 increases the collector current Ic, but the power consumption of the bipolar transistor decreases. Moreover, a decrease in the power consumption drops the temperature of the bipolar transistor, so that the transfer characteristic of the bipolar transistor approaches the curve S3. Contrarily, a decrease in the base-emitter voltage Vbe from the voltage Vop1 decreases the collector current Ic, but the power consumption of the bipolar transistor increases. Then, an increase in the power consumption raises the temperature of the bipolar transistor, so that transfer characteristic of the bipolar transistor approaches the curve S2. Accordingly, the trans-conductance gm3 of the bipolar transistor that operates under the second operation mode substantially corresponds to the slope of the line connecting the two points Q3 on the curve S2 and Q6 on the curve S3, at which the base-emitter voltage Vbe become Vop2 and Vop3, respectively. The trans-conductance gm3 becomes smaller than the aforementioned trans-conductance gm1 corresponding to the slope of the line connecting the point Q1 and Q2, as shown in FIG. 4.

Fourth, further another case in which the bipolar transistor driven by an input signal containing only high frequencies operates under the second operation mode is explained. In this case, as described above, the temperature of the bipolar transistor becomes unable to respond to the instant value of the power consumption that shows a quick change synchronous with the input signal, and stays in a constant temperature that depends on the average of the power consumption, specifically temperature T (° C.) in FIG. 4. Accordingly, the trans-conductance of this case becomes equal to gm1.

As explained above, when the bipolar transistor operates under the second operation mode, the trans-conductance in the low frequencies becomes smaller than that in the high frequencies.

Referring back to FIG. 2, as explained above, in the amplifier 100, the transistor 42 is operated under the second operation mode: the increase in the collector current decreases the power consumption of the bipolar transistor. However, the transistors 10, 20 in FIG. 1 are operated under the first operation mode, like conventional amplifiers.

Specifically, the transistor 42 may be operated under the second operation mode by setting slope (in an absolute value) of the load line smaller than that (substantially corresponding to a derivative) at the bias point on the contour line, for example, one of the curves P1 to P8. For example, when the collector-emitter voltage is set to be less than 1.7 V (while, the lower limit thereof is greater than or equal to 0.7 V), the slope of the contour line increases so that the slope of the load line like the load line LB1 in FIG. 3 becomes smaller than that of the bias point B1 on the contour line for the power consumption of 7.5 mW (P3) as shown in FIG. 3. More specifically, in FIG. 2, by assuming the source current I2 (second source current) of the current source 43 to be 6 mA, the resistance of the resistive element Rf to be 48 kΩ, the supply voltage of the node N3 to be 5 V, the bias signal Vbias generated by the bias circuit 44 to be 0.9 V; the bias point and the load line of the transistor 42 become B2 and LB2, respectively. These assumptions are just examples and other conditions are applicable for setting the transistor 42 to operate in the second operation mode. Namely, the source current I2 of the current source 43 may be applicable in a range from 1 mA to 10 mA. The resistance Rf of resistive element may be applicable in a range from 1 kΩ to 100 kΩ. The supply voltage of the node N3 may be applicable in a range from 3 V to 10 V. The bias signal Vbias may be applicable in a range from 0.5 V to 3 V.

Moreover, the transistors 10, 20 may be operable under the first operation mode by setting the slope (in an absolute value) of the load line greater than that (substantially corresponding to a derivative) at the bias point on the contour line, for example, one of the curve P1 to P8. For example, when the collector-emitter voltages of the transistors 10, 20 are set to be greater than or equal to 1.7 V (but the upper limit thereof to be smaller than and equal to 3.5 V), the slope of the contour line decreases so that slope (in an absolute value) of the load line like the load line LA1 in FIG. 3 becomes larger than that at the bias point A1 on the contour line for the power consumption of 7.5 mW (P3) in FIG. 3. More specifically, in FIG. 1, assuming the source current I1 (first source current) of the current source 30 to be 3 mA, the resistance of the resistive elements RC1, RC2 to be 00Ω, the supply voltages of the nodes N1, N2 to be 5 V, the voltage level of the input signal input to the bases 10b, 20b to be less than 1.8 V; the bias point and the load line of the transistors 10, 20 become A2 and LA2, respectively. These assumptions are just examples; and other conditions are applicable for setting the transistors 10, 20 to operate in the first operating mode. Namely, the source current I1 of the current source 30 may be set in a range from 1 mA to 10 mA. The resistances of resistive elements RC1, RC2 may be set in a range from 10Ω to 1 kΩ. The potential of the nodes N1, N2 may be set in a range from 3 V to 10 V. The voltage level of the input signal input to the bases 10b, 20b of the transistor 10, 20 may be set in a range from 0.5 V to 3 V.

Here, in the compensator 40, change in trans-conductance of the transistor 42 causes change in impedance of the compensator 40. As explained above, in the compensator 40, the transistor 42 and the resistive element Rf constitute a negative feedback circuit. In this configuration, when the impedance of the compensator 40 seen from the base 20b of the transistor 20 is represented by Rin (resistive component), the Rin can be expressed by the formula Rin=Rf/(β+1), where Rf is resistance of the resistive element Rf, and β is gain of the amplifier that the transistor 42 and the current source 43 constitute, which is proportional to trans-conductance of the transistor 42. The trans-conductance of the transistor 42 decreases in a low frequency band, and increases in a high frequency band. Therefore, the impedance Rin of the compensator 40 becomes large in the low frequency band and small in the high frequency band.

With reference to FIGS. 1 and 2, operation of the amplifier 100 is explained. When the input signal Vin is input to the base 10b of the transistor 10, the emitter current of the transistor 10 changes in response to the input signal Vin. Change in the emitter current of the transistor 10 causes change in the emitter current of the transistor 20 so as to keep the source current I1 supplied by the current source constant. Accordingly, the emitter current of the transistor 10 and the emitter current of the transistor 20 have opposite phases to each other. At this time, the collector current of the transistor 10 and the collector current of the transistor 20 also have opposite phases to each other. The corrector currents of the transistor 10 and 20 cause respective voltage drops of the resistive element RC1 and RC2. Consequently, complementary output signals Vout1, Vout2 that have opposite phases to each other are output at collector 10c of the transistor 10, at collector 20c of the transistor 20, respectively. Thereby, the amplifier 100 converts the single-ended signal (the input signal Vin) into a differential signal (the output signals Vout1, Vout2).

In the amplifier 100, the operational conditions of the transistors 10 and 20 in FIG. 1 is set the first operation mode: the respective power consumptions of the transistors 10 an 20 increase with increasing in the respective collector currents thereof. Therefore, the aforementioned amplifier 100 shows some peaking, namely increasing in gain, in a low frequency band less than a critical frequency.

Here, in the amplifier 100, the base current Ib2 of the transistor 20 is supplied from the compensator 40. Specifically, some portion of the source current I2 supplied by the current source 43 flows into the base 20b of the transistor 20 through the negative feedback circuit constituted of the transistor 42 and the resistive element Rf. As explained above, the impedance Rin of the compensator 40 becomes larger in a low frequency band. An increase in the impedance Rin increases voltage drop of the compensator 40 caused by the base current Ib2 that the compensator 40 supplies to the base 20b of the transistor 20. An increase in the voltage drop lowers voltage of the base 20b (base voltage) of the transistor 20, and thereby decreases differential gain of the transistors 10, 20. Accordingly, the amplifier 100 suppresses the peaking in gain in the low frequency band.

Figure 5:
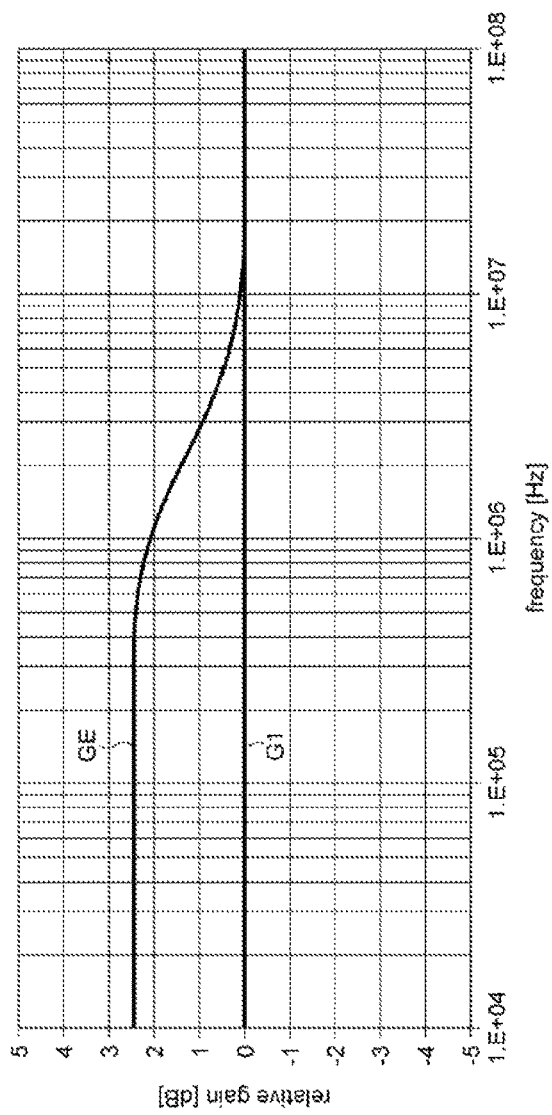
FIG. 5 is frequency dependence of gain of differential amplifier.
Figure 6:
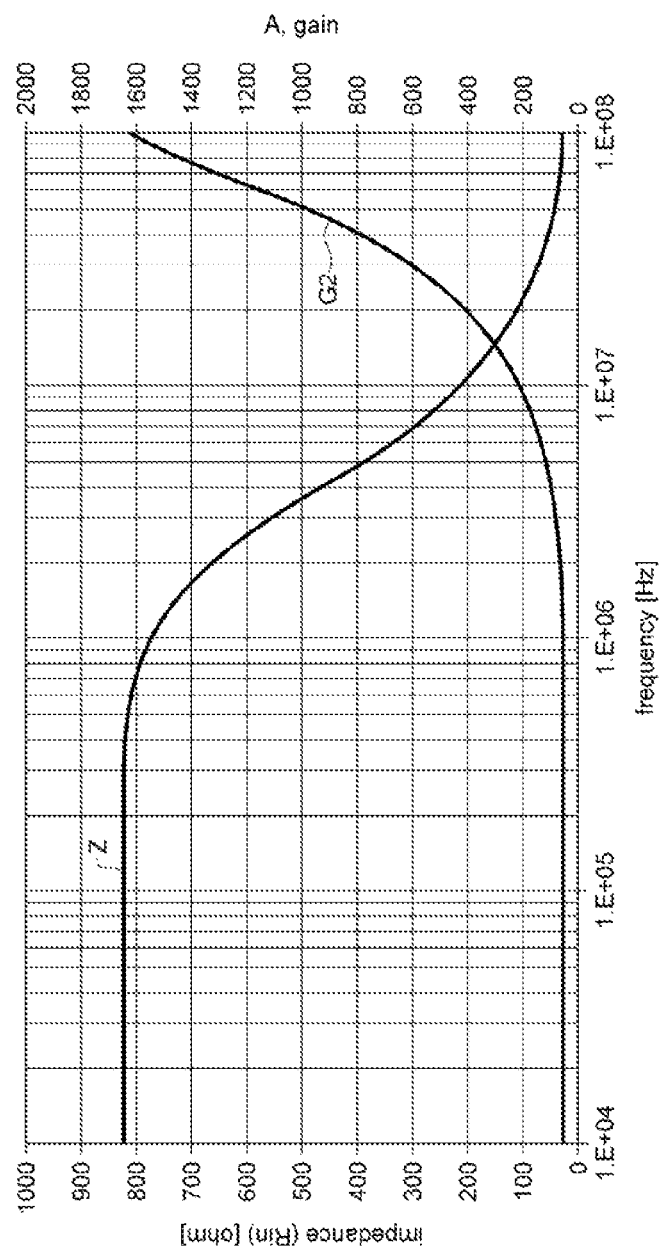
FIG. 6 is frequency dependence of impedance of the compensator and frequency dependence of gain of the negative feedback circuit.

With referring to FIGS. 5 and 6, the advantages of the amplifier 100 according to the embodiment of the present invention is explained.

FIG. 5 is frequency dependence of gain of a differential amplifier. The horizontal axis corresponds to a frequency, while the vertical axis corresponds to a relative gain, whose reference level (0 dB) is set to a gain in a high frequency band more than 10 MHz.

In FIG. 5, the curve G1 shows frequency dependence of gain of the amplifier 100 and the curve GE shows frequency dependence of gain of a comparative example. The curve G1 is derived from a circuit simulation, in which various parameters like characteristics of respective elements, potentials at nodes, and source currents of current sources, and so on are appropriately taken into account. The curve GE is derived from also another circuit simulation under the same condition but for a comparative differential amplifier that does not include the compensator 40, in which a constant voltage is applied to the base 20a of the transistor 20 as the reference signal.

As shown in FIG. 5, frequency characteristics of the comparative example (the curve GE) has peaking (increasing in gain) in a low frequency band less than 10 MHz: namely the frequency characteristics is not flat. Contrarily, frequency characteristics of the amplifier 100 (the curve G1) has no peaking: namely the frequency characteristics is flat because the compensator 40 compensates the peaking in gain in the low frequency band.

FIG. 6 shows frequency dependence of impedance of the compensator 40 in FIG. 2 and gain of the negative feedback circuit that the transistor 42 and the resistive element Rf constitute, which are derived from the circuit simulation for the curve G1 in FIG. 5. The horizontal axis corresponds to a frequency. The vertical axis in the left-hand side corresponds to a magnitude of impedance and the vertical axis in the right-hand side corresponds to a gain A of the negative feedback circuit. In FIG. 6, the curve G2 shows frequency dependence of gain A of the negative feedback circuit and the curve Z shows frequency dependence of the impedance Rin.

First, the frequency dependence of the impedance Rin is explained. As shown by the curve Z, the impedance Rin increases when frequency decreases. In a high frequency band more than 10 MHz, the impedance Rin becomes about 200Ω at most around 10 MHz, about 50Ω at most around 100 MHz. In contrast, in a low frequency band less than or equal to 10 MHz, the impedance Rin becomes greater than 200 Ω at least, further exceeds 800Ω at frequencies less than 700 kHz.

The frequency dependence of the impedance Rin is related to the frequency dependence of the gain A of the negative feedback circuit. As shown by the curve G2, the gain A becomes more than 200 at least around 10 MHz, further reaches about 1600 around 100 MHz. In contrast, in a low frequency band, the gain A is about 200 at most and reduced to less than 100 in the vicinity of 3 MHz.

As explained above, the amplifier 100 including the compensator 40 may improve the frequency dependence of differential gain shown by the comparative example without the compensator 40.

Figure 7:
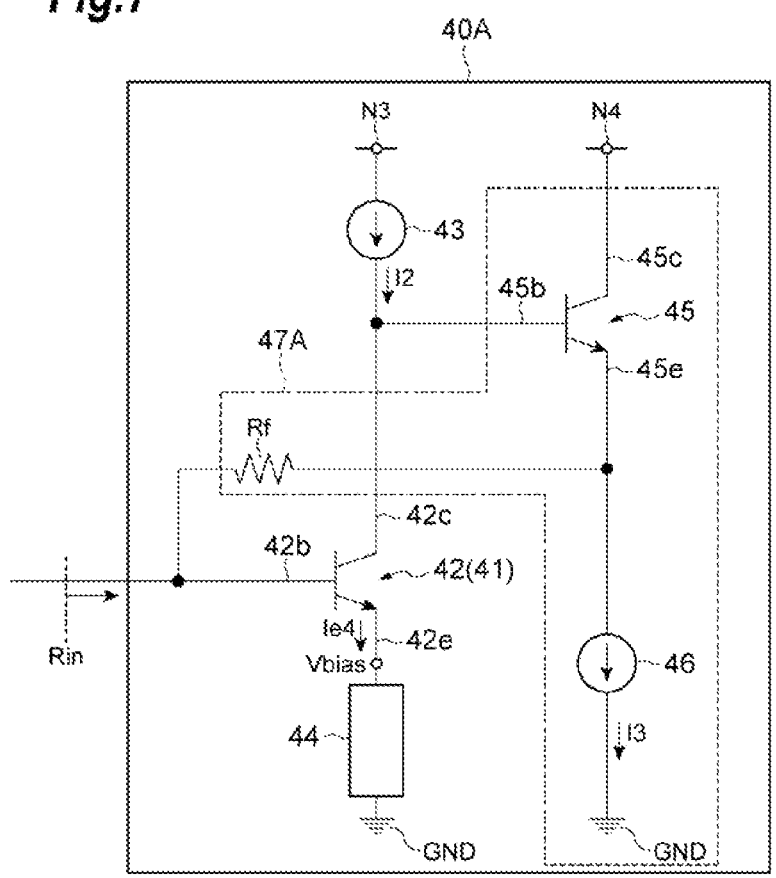
FIG. 7 is a circuit diagram of a variation of the compensator.

FIG. 7 is a circuit diagram of a variation of the compensator 40. The compensator 40A in FIG. 7 further includes a transistor 45 and a current source 46, and has another feedback loop, in comparison with the compensator 40 in FIG. 2.

In the compensator 40A, the collector 42c of the transistor 42 is connected not only with the current source 43 but also with the base 45b of the transistor 45. In addition, the resistive element Rf is connected between the emitter 45e of the transistor 45 and the base 42b of the transistor 42. The current source 46 is connected between the emitter 45e and the ground so that the source current I3 flows from the emitter 45e to the ground. The node N4 supplies a potential (supply voltage), which is necessary for operating the transistor 45. The collector 45c of the transistor 45 is connected with the node N4. The compensator 40A includes an emitter follower that the transistor 45 and the current source 46 constitute. An input terminal of the emitter follower, which corresponds to a base 45b of the transistor 45, is connected with the collector 42c of the transistor 42. An output terminal of the emitter follower, which corresponds to the emitter 45e of the transistor 45, is connected with the resistive element Rf.

In the compensator 40A, the output signal output from the collector 42c of the transistor 42 is fed back to the base 42b of the transistor 42 through the resistive element Rf and the emitter follower that the transistor 45 and the current source 46 constitute. Namely, the resistive element Rf, the transistor 45, and the current source 46 constitute a feedback loop from the collector 42c to the base 42b of the transistor 42. The emitter follower shifts the voltage of the collector 42c of the transistor 42 by the base-emitter voltage of the transistor 45, and feeds the shifted voltage back to the base 42b of the transistor 42 through the resistive element Rf.

Figure 8:
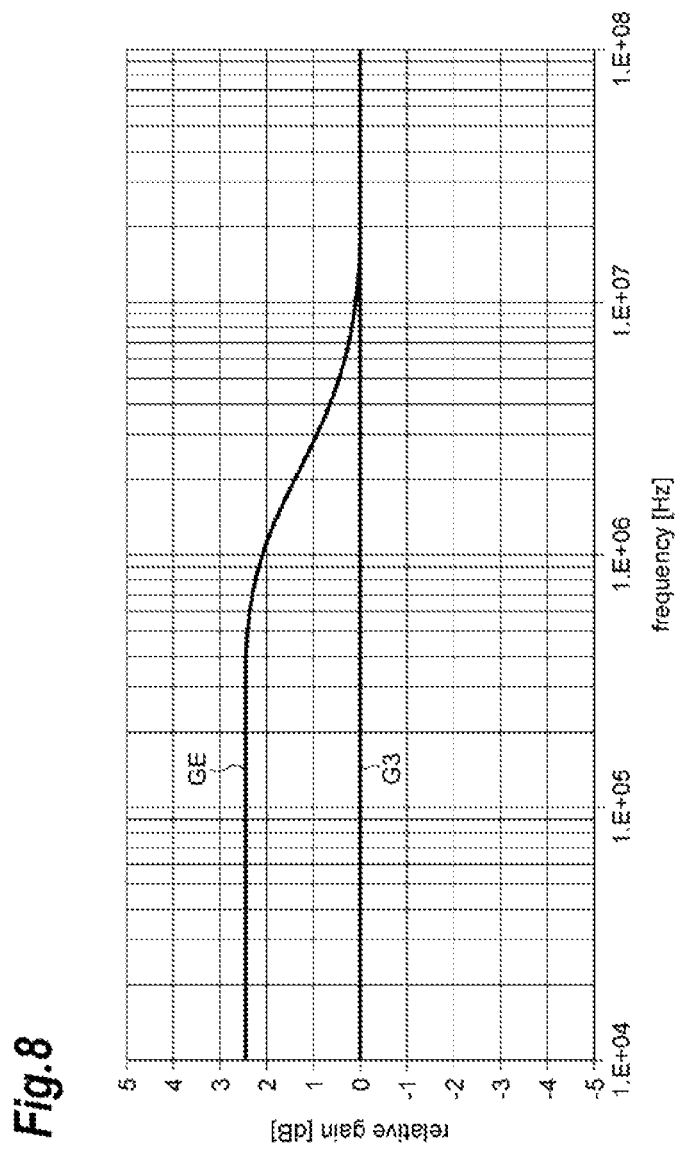
FIG. 8 is frequency dependence of gain of the amplifier in FIG. 1 with the compensator in FIG. 7.

FIG. 8 is frequency dependence of gain of the amplifier 100 in FIG. 1 in which the compensator 40 is replaced with the compensator 40A. the curve G3 shows frequency dependence of gain of the amplifier 100 and the curve GE shows frequency dependence of gain of the same comparative example shown in FIG. 5. The frequency characteristic of the amplifier 100 (the curve G3) becomes flat as well as the frequency characteristic of the curve G1 in FIG. 5. Accordingly, the amplifier 100 with the compensator 40A suppresses the peaking in gain in the low frequency band.

Figure 9:
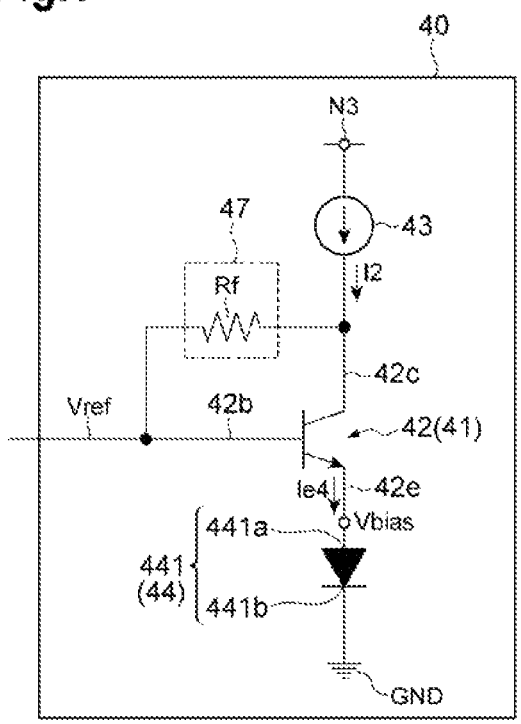
FIG. 9 is a circuit diagram of an example of a bias circuit.

FIG. 9 is a circuit diagram of an example of the bias circuit 44 in FIG. 2. In FIG. 9, the diode 441 corresponds to the bias circuit 44. The diode 441 has an anode 441a and a cathode 441b. The anode 441a is connected with the emitter 42e of the transistor 42. The cathode 441b is connected with the ground.

In the configuration shown in FIG. 9, some portion of the source current I2 supplied by the current source 43 flows through the transistor 42 and into the anode 441a toward the cathode 441b. Thus, a voltage drop of the diode 441 caused by the forward current flowing through the diode 441 is provided as a bias signal Vbias. Namely, the bias circuit 44 generates the bias signal Vbias (bias voltage) at the anode 441a of the diode 44 by the emitter current Ie4 output from the emitter 42e of the transistor 42.

For the impedance of the bias circuit (diode 441) seen from the emitter 42e of the transistor 42, a lower (smaller) value in a wider frequency band is preferable. In FIG. 9, the impedance of the diode 441 seen from the emitter 42e of the transistor 42 can be reduced in a wide frequency band, because the anode 441a is connected to the emitter 42e. If the impedance of the diode 441 shows some ripple in frequency characteristics thereof, The diode 441 can prevent such ripple from affecting the compensator 40. Moreover, the diode 441 may prevent the impedance of the compensator 40 from increasing, because the gain of the negative feedback circuit that the transistor 42 and the resistive element Rf constitute is kept sufficiently large.

Here, the diode 441 may be provided on the same semiconductor die with the transistors 10, 20 in FIG. 1 as well as the transistor 42, by an conventional semiconductor process. By providing the transistor 42 and the diode 441 in the compensator 40 on the same semiconductor die as the transistors 10, 20, temperature characteristics of the compensator 40 can be matched with temperature characteristic of the transistors 10, 20 (for example, temperature characteristics of gain of the differential amplifier that the transistors 10, 20 constitute). Specifically, by matching the thermal time constants (thermal response) of electrical elements (transistor 42, diode 441, and so on) in the compensator 40 in the amplifier 100 with those of electrical elements in the other portions in the amplifier 100, compensation (for example, frequency adjustment) for a difference between different thermal time constants may be omitted.

Figure 10:
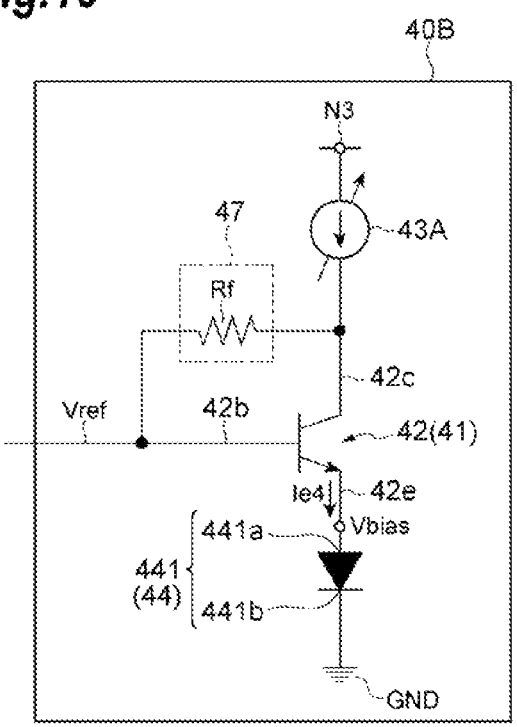
FIG. 10 is a circuit diagram of other example of the compensator.

FIG. 10 is a circuit diagram of another example of the compensator 40. The compensator 40B in FIG. 10 differs from the compensator 40 in FIG. 9 in the current source 43A that is replaced with the current source 43.

The current source 43A is a variable current circuit configured to adjust the source current. The current source 43A may not be restricted to the specific configuration shown in FIG. 10. For example, the variable current circuit may be configured from a current circuit that comprises transistors, diodes, resistive elements, and so on by making resistance of the resistive elements variable.

The current source 43A may compensate the peaking in gain in a low frequency band by adjusting the source current when magnitude of the peaking deviates from a typical value depending on production tolerance.

The compensator 40B may adjust resistance of the resistive element Rf instead of the source current supplied by the current source 43A. For example, the resistive element Rf may be configured by combining a switch with a plural of resistive elements, so that the resistance of the resistive element Rf can be changed by selecting one from the resistive elements using the switch.

The Second Embodiment

Figure 11:
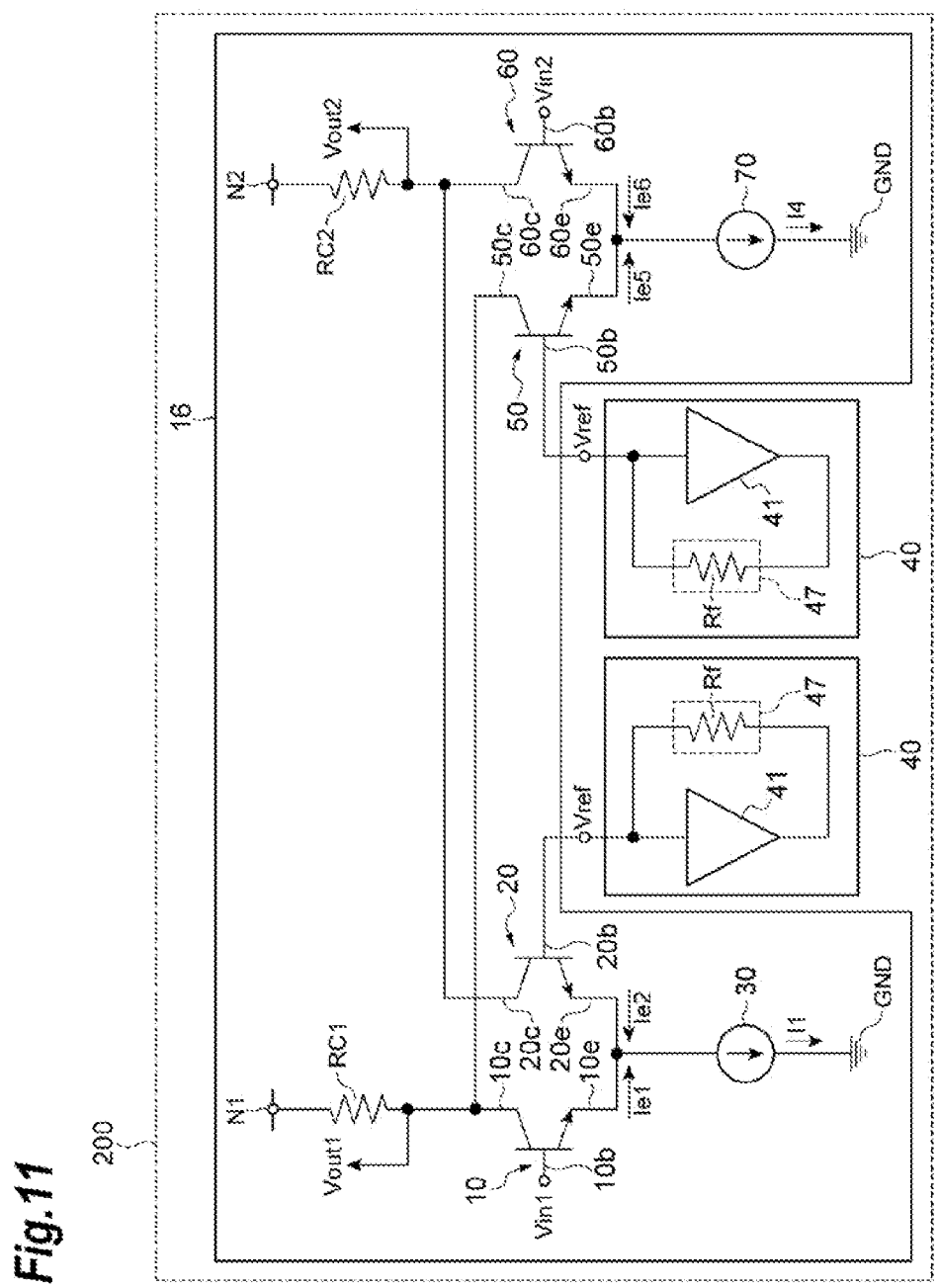
FIG. 11 is a circuit diagram of an example of the amplifier according to the second embodiment of the present invention.

FIG. 11 is a circuit diagram of an example of the amplifier according to the second embodiment of the present invention. The amplifier 200 amplifies a differential input signal, defined as a difference between the input signals Vin1, Vin2. The input signals Vin1, Vin2 are complementary signals that have opposite phases by 180° to each other. When one of the input signals Vin1, Vin2 increases, the other of the input signals Vin1, Vin2 decreases. For example, difference between the input signals Vin1, Vin2 corresponds to a differential signal Vin1−Vin2. The amplifier 200 may be installed in an optical receiver used in optical communication systems, in the same way as the amplifier 100 explained with reference to FIG. 1. In such application, the optical receiver generates the input signals Vin1, Vin2 depending on an optical signal that the optical receiver receives. The amplifier 200 may be provided on single semiconductor die as well as the amplifier 100.

As shown in FIG. 11, the amplifier 200 differs from the amplifier 100 in FIG. 1 in a differential amplifier 16 that has been replaced from the amplifier 15. The differential amplifier 16 differs from the differential amplifier 16 in further comprising transistors 50, 60, and a current source 70, and changing the interconnections related to the added elements. Moreover, the amplifier 200 includes two compensators 40.

The transistor 50 is a fourth transistor having a base 50b, a collector 50c, and an emitter 50e. The base 50b receives a reference signal Vref. The collector 50c is connected with the collector 10c of the transistor 10, and outputs the output signal Vout1. The emitter 50e is connected with the current source 70.

The transistor 60 is a fourth transistor having a base 60b, a collector 60c, and an emitter 60e. The base 60b receives the input signal Vin2. The collector 60c is connected with the collector 20c of the transistor 20, and outputs the output signal Vout2. The emitter 60e is connected with the current source 70.

In the differential amplifier 16, the transistors 50, 60 may be bipolar transistors, specifically, HBTs, as well as the transistors 10, 20. In the amplifier 200, the operational condition of the transistors 50, 60 is set to the first operation mode like the transistors 10, 20. Namely, when the collector currents thereof increase, power consumptions thereof also increase.

The current source 70 is a fourth current source configured to supply the source current I4. The current source 70 is connected between a point (node) commonly connected with the emitters 50e, 60e and the ground so that the source current I4 flows from the point commonly connected with the emitters 50e, 60e to the ground. The current source 70 may be configured like the current source 30 as explained with reference to FIG. 1.

In the amplifier 200, the resistive element RC1 is connected between a point commonly connected with the collectors 10c, 50c of the transistors 10, 50 and a node N1. The node N1 supplies a potential (supply voltage) which is necessary for operating the transistors 10, 50. The resistive element RC2 is connected between the point commonly connected with the collectors 20c, 60c of the transistors 20, 60 and a node N2. The node N2 supplies a potential (supply voltage) which is necessary for operating the transistors 20, 60.

The differential amplifier 16 receives the input signals Vin1, Vin2 at the bases 10b, 60b of the transistors 10, 60, respectively, and receives a reference signal Vref and another reference signal Vref at the bases 20b, 50b of the transistors 20, 50, respectively.

The transistors 10, 20 divides the source current I1 supplied by the current source 30 into an emitter current Ie1 that flows through the emitter 10e of the transistor 10 and an emitter current Ie2 that flows through the emitter 20e of the transistor 20, in response to a difference between the input signal Vin1 and one of the reference signals Vref. The transistors 50, 60 divides the source current I4 supplied by the current source 70 into an emitter current Ie5 that flows through the emitter 50e of the transistor 50 and an emitter current Ie6 that flows through the emitter 60e of the transistor 60, in response to a difference between the input signal Vin2 and the other of the reference signals Vref. The collector 10c of the transistor 10 is connected with the collector 50c of the transistor 50, and the collector 20c of the transistor 20 is connected with the collector 60c of the transistor 60. The differential amplifier 16 generates a differential signal (for example, Vout1−Vout2) depending on a difference between a potential of the collectors 10c, 50c and a potential of the collectors 20c, 60c.

Next, operation of the amplifier 200 is explained. When the input signals Vin1, Vin2 are input to the bases 10b, 60b of the transistors 10, 60, respectively, the respective emitter currents of the transistors 10, 60 changes in response to the input signals Vin1, Vin2. As the input signals Vin1, Vin2 are complementary signals that have opposite phases to each other, the respective emitter currents of the transistor 10, 60 also have opposite phases to each other. Accordingly, the respective collector currents of the transistors 10, 60 have opposite phases to each other.

When the input signal Vin1 is input to the base 10b of the transistor 10, the collector currents of the transistor 10, 20 have opposite phase to each other, as explained above with reference to FIG. 1, 2, because the source current I1 supplied by the current source 30 is kept constant. Likewise, when the input signal Vin2 is input to the base 60b of the transistor 60, the collector currents of the transistor 50, 60 have opposite phase to each other, because the source current I4 supplied by the current source 70 is kept constant. Accordingly, the collector currents of the transistors 10, 50 have the same phase as the input signal Vin1, and the collector currents of the transistors 20, 60 have these same phase as the input signal Vin2.

As the input signals Vin1, Vin2 have opposite phases to each other, a sum of the collector currents of the transistors 10, 50 and a sum of the collector currents of the transistors 20, 60 have opposite phases to each other. Then, respective voltage drops of the resistive elements RC1 and RC2 caused by the collector currents have opposite phases to each other. Therefore, the collectors 10c, 50c of the transistors 10, 50 outputs the output signal Vout1 and the collectors 20c, 60c of the transistors 20, 60 outputs the output signal Vout2. Consequently, the amplifier 200 receives a differential input signal (the input signal Vin1 and Vin2), and outputs a differential signal (the output signals Vout1, Vout2).

In the amplifier 200, the operational condition of the transistors 10, 20, 50, and 60 is set to operate in the first operation mode. Therefore, the amplifier 200 may shows a peaking (increasing) in gain in a low frequency band.

Here, in the amplifier 200, the base currents of the transistors 20, 50 are supplied from the two separated compensators 40, respectively. Voltages (base voltages) of the bases 20b, 50b of the transistors 20, 50 decrease in the low frequency band, as described above with reference to FIGS. 1 and 2. Accordingly, the amplifier 200 suppresses the peaking in gain in the low frequency band, in the same way as the amplifier 100 (FIG. 1). The transistors 10, 20 and the transistors 50, 60 are paired respectively, and each pair of the transistors performs differential amplification. For example, in the differential amplification by the transistors 10, 20, when the input signal Vin1 is input to the base of the transistor 10, input impedance of the compensators 40 increases in a low frequency band (less than several Mega Herz or 10 MHz) and drops the base of the transistor 20 to reduce gain of amplification by the transistors 10, 20. Thus, the peaking in a low frequency band may be compensated with the decrease in gain originated from the compensators 40. Likewise, in the differential amplification by the transistors 50, 60, when the input signal Vin2 is input to the base of the transistor 60, input impedance of the compensators 40 increases in a low frequency band (less than several Mega Herz or 10 MHz) and drops the base of the transistor 50 to decrease gain of amplification by the transistors 50, 60. Thus, the peaking in gain in a low frequency band may be compensated with the decrease in gain originated from the compensators 40.

As the input signals Vin1, Vin2 are complementary signals each having an opposite phase to each other, base voltages of the transistors 20, 50 moves oppositely to each other. If only one compensator is provided to supply the reference signal Vref and the base current concurrently to the bases of the transistors 20, 50, respective increases in the base voltages will be mutually offset, so that the peaking in gain in a low frequency cannot be compensated. Therefore, base current needs to be supplied separately to respective bases of the transistor 20, 50 from the two compensators 40, which are separated from each other.

In the amplifier 200, electrical elements included in the two compensators 40 may be provided on the same semiconductor die by the conventional semiconductor process as the transistors 10, 20, 50 and 60, so that temperature characteristics of the transistors in the two compensators 40 can be matched with those of the transistors 10, 20, 50, and 60, in the same way as the amplifier 100. The transistors 10, 20, 50, 60, and 40 provided on a single semiconductor die have temperatures same to each other when they are operating, as long as size of the semiconductor die is less than 10 mm square.

Figure 12:
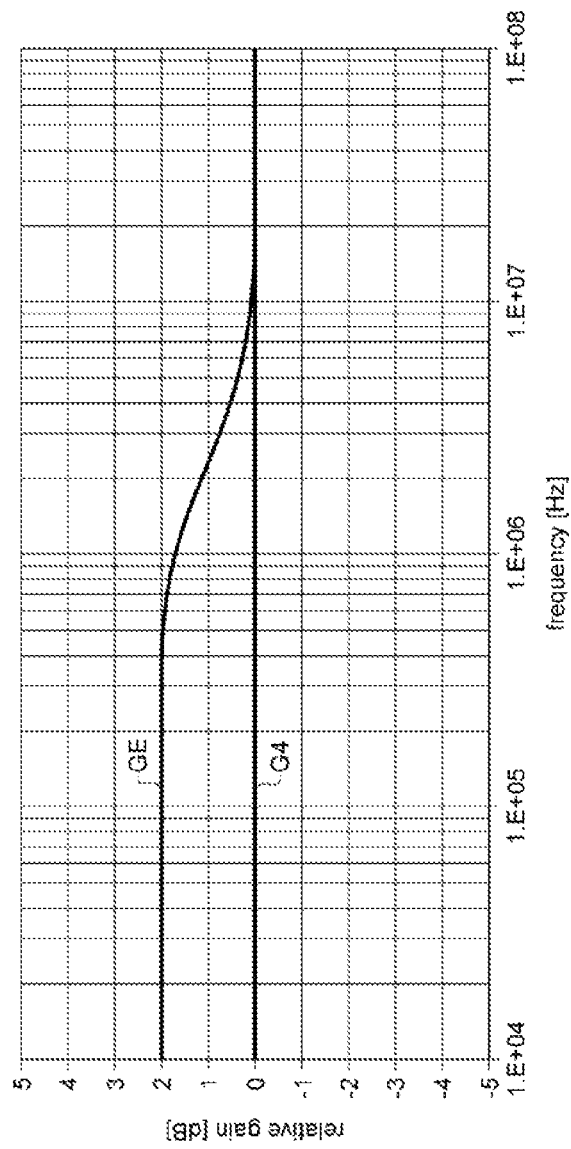
FIG. 12 is frequency dependence of gain of an example of the amplifier.

FIG. 12 is frequency dependence of gain of an example of the amplifier 200. The curve G4 shows frequency dependence of gain of an example of the amplifier 200 and the curve GE shows frequency dependence of gain of the comparative example explained above with reference to FIG. 5. The frequency characteristics shown by the curve G4 is flat as well as the frequency characteristics shown by the curve G1 in FIG. 5. Accordingly, the amplifier 200 suppresses the peaking in gain in the low frequency band.

The amplifiers according to an aspect of the present invention are not restricted to the embodiments described above. An amplifier with a configuration in which some features of the embodiments described above are combined may be included in the embodiment of the present invention. For example, in the amplifier 200 in FIG. 11, an amplifier with a configuration in which the compensator 40A in FIG. 7 or the compensator 40B in FIG. 10 is adopted instead of the compensator 40 can be included in the embodiment of the present invention. Moreover, some ranges of the source current, resistance of the resistive elements, and so on for setting the operational conditions of the transistors 10, 20, and 42, have been showed as examples on the basis of the statistic characteristics of an example in FIG. 3. Therefore, when the first and second operation modes are set for other statistic characteristics of other examples, some values out of the ranges described above may be selected as long as these values meet the technical requirements described above.

What is claimed is:

1. An amplifier that amplifies an input signal and outputs a differential signal derived from the input signal, comprising:
    a differential amplifier including a first current source, a first paired transistor, and a second paired transistor, the first current source supplying a first source current to the first paired transistor and the second paired transistor, the first paired transistor receiving the input signal at a base thereof, the second paired transistor receiving a reference signal at a base thereof, the first paired transistor and the second paired transistor being configured to divide the first source current into a first current that flows through an emitter of the first paired transistor and a second current that flows through an emitter of the second transistor in response to a difference between the input signal and the reference signal, the differential amplifier being configured to output a voltage difference between collectors of the first paired transistor and the second paired transistor as the differential signal, and
    a compensator including an amplifying transistor and a feedback circuit that feeds an output signal generated at a collector of the amplifying transistor back to a base of the amplifying transistor therethrough, the compensator being configured to output the reference signal generated at the base of the amplifying transistor, wherein the compensator decreases a power consumption of the amplifying transistor when a collector current output from the collector of the amplifying transistor increases, and increases the power consumption of the amplifying transistor when the collector current output from the collector of the amplifying transistor decreases.

2. The amplifier according to claim 1, wherein the compensator further includes:
    a second current source connected with the collector of the amplifying transistor, and
    a bias circuit connected with an emitter of the amplifying transistor, the bias circuit being configured to generate a bias voltage by making an emitter current output from the emitter of the amplifying transistor flow thereinto,
    wherein the compensator provides a sum of the bias voltage and a voltage between the base of the amplifying transistor and the emitter of the amplifying transistor as the reference signal.

3. The amplifier according to claim 2, wherein
    the bias circuit includes a diode having an anode and a cathode, and
    wherein the anode of the diode is connected with the emitter of the amplifying transistor, and the cathode of the diode is grounded.

4. The amplifier according to claim 3, wherein the first paired transistor, the second paired transistor, the amplifying transistor, and the diode are provided on a single semiconductor die.

5. The amplifier according to claim 1, wherein
    the first paired transistor, the second paired transistor, and the amplifying transistor are provided on a single semiconductor die.

6. The amplifier according to claim 1, wherein
    the first paired transistor, the second paired transistor, and the amplifying transistor are hetero junction bipolar transistors.

7. An amplifier that amplifies an input signal and outputs a differential signal derived from the input signal, comprising:
    a differential amplifier including a first current source, a first paired transistor, and a second paired transistor, the first current source supplying a first source current to the first paired transistor and the second paired transistor, the first paired transistor receiving the input signal at a base thereof, the second paired transistor receiving a reference signal at a base thereof, the first paired transistor and the second paired transistor being configured to divide the first source current into a first current that flows through an emitter of the first paired transistor and a second current that flows through an emitter of the second paired transistor in response to a difference between the input signal and the reference signal, the differential amplifier being configured to output a voltage difference between collectors of the first transistor and the second transistor as the differential signal, and
    a compensator including an amplifying transistor, an emitter follower, and a feedback circuit, the amplifying transistor having a collector connected with an input terminal of the emitter follower, the feedback circuit being configured to feed an output signal output from the emitter follower back to a base of the amplifying transistor therethrough, the compensator being configured to output the reference signal generated at the base of the second transistor, wherein the compensator decreases a power consumption of the amplifying transistor when a collector current of the amplifying transistor increases, and increases the power consumption of the amplifying transistor when the collector current of the amplifying transistor decreases.

8. The amplifier according to claim 7, wherein the compensator further includes:
    a second current source connected with the collector of the amplifying transistor, and
    a bias circuit connected with an emitter of the amplifying transistor, the bias circuit being configured to generate a bias voltage by making an emitter current output from the emitter of the amplifying transistor flow thereinto,
    wherein the compensator provides a sum of the bias voltage and a voltage between the base of the amplifying transistor and the emitter of the amplifying transistor as the reference signal.

9. The amplifier according to claim 8, wherein
    the bias circuit includes a diode having an anode and a cathode, and
    wherein the anode of the diode is connected with the emitter of the second transistor, and the cathode of the diode is grounded.

10. The amplifier according to claim 9, wherein
    the first paired transistor, the second paired transistor, the amplifying transistor, and the diode are provided on a single semiconductor die.

11. The amplifier according to claim 7, wherein
    the first paired transistor, the second paired transistor, and the amplifying transistor are provided on a single semiconductor die.

12. The amplifier according to claim 7, wherein
    the first paired transistor, the second paired transistor, and the amplifying transistor are hetero-junction bipolar transistors.

13. An amplifier that amplifies a differential input signal and outputs a differential output signal derived from the differential input signal, the differential input signal consisting of a positive-phase input signal and a negative-phase input signal, the differential output signal consisting of a positive-phase output signal and a negative-phase output signal, comprising:
    a first differential amplifier including a first current source, a first paired transistor, and a second paired transistor, the first current source supplying a first source current to the first paired transistor and the second paired transistor, the first paired transistor receiving the positive-phase input signal at a base thereof, the second paired transistor receiving a first reference signal at a base thereof, the first paired transistor and the second paired transistor being configured to divide the first source current into a first current that flows through an emitter of the first paired transistor and a second current that flows through an emitter of the second transistor in response to a difference between the positive-phase input signal and the reference signal, the first differential amplifier being configured to output a voltage at a collector of the first paired transistor as the negative-phase output signal,
    a second differential amplifier including a second current source, a third paired transistor, and a fourth paired transistor, the second current source supplying a second source current to the third paired transistor and the fourth paired transistor, the third paired transistor receiving the negative-phase input signal at a base thereof, the fourth paired transistor receiving a second reference signal at a base thereof, the third paired transistor and the fourth paired transistor being configured to divide the second source current into a third current that flows through an emitter of the third paired transistor and a fourth current that flows through an emitter of the fourth paired transistor in response to a difference between the negative-phase input signal and a second reference signal, the second differential amplifier being configured to output a voltage at a collector of the third paired transistor as the positive-phase output signal, a first compensator including a first amplifying transistor and a first feedback circuit that feeds a first output signal generated at a collector of the first amplifying transistor back to a base of the first amplifying transistor therethrough, the first compensator being configured to output the first reference signal generated at the base of the first amplifying transistor, and a second compensator including a second amplifying transistor and a second feedback circuit that feeds a second output signal generated at a collector of the second amplifying transistor back to a base of the second amplifying transistor therethrough, the second compensator being configured to output the second reference signal generated at the base of the second amplifying transistor, wherein the first compensator decreases a power consumption of the first amplifying transistor when a collector current output from the collector of the first amplifying transistor increases, and increases the power consumption of the first amplifying transistor when the collector current output from the collector of the first amplifying transistor decreases, and wherein the second compensator decreases a power consumption of the second amplifying transistor when a collector current output from the collector of the second amplifying transistor increases, and increases the power consumption of the second amplifying transistor when the collector current output from the collector of the second amplifying transistor decreases.

* * * * *